(12) United States Patent
Chang et al.

(10) Patent No.: US 9,514,817 B1
(45) Date of Patent: Dec. 6, 2016

(54) NON-VOLATILE MEMORY DEVICE WITH MEMRISTOR

(71) Applicants: Ningbo Advanced Memory Technology Corporation, Ningbo (CN); Being Advanced Memory Taiwan Limited, Hsinchu County (TW)

(72) Inventors: Jia-Hwang Chang, Hsinchu County (TW); Jui-Jen Wu, Hsinchu County (TW); Sheng-Tsai Huang, Hsinchu County (TW); Fan-Yi Jien, Hsinchu County (TW)

(73) Assignees: Ningbo Advanced Memory Technology Corporation, Ningbo (CN); Being Advanced Memory Taiwan Limited, Hsinchu County (TW)

( * ) Notice: Subject to any disclaimer, the term of this patent is extended or adjusted under 35 U.S.C. 154(b) by 0 days.

(21) Appl. No.: 15/008,463

(22) Filed: Jan. 28, 2016

(30) Foreign Application Priority Data

Jul. 14, 2015 (CN) .......................... 2015 1 0412644

(51) Int. Cl.
G11C 13/00 (2006.01)
H01L 47/00 (2006.01)
G11C 15/04 (2006.01)

(52) U.S. Cl.
CPC ......... *G11C 15/046* (2013.01); *G11C 13/0026* (2013.01)

(58) Field of Classification Search
CPC ............. G11C 13/0007; G11C 13/0069; G11C 13/004; G11C 13/0002; G11C 2213/77; G11C 2013/0073; G11C 11/16; G11C 2013/0092; G11C 11/15; G11C 11/4096; G11C 13/0011; G11C 13/0023; G11C 13/0061; G11C 13/0097; G11C 16/26; H01L 47/2436; H01L 27/228; H01L 47/00
USPC ............. 365/49.1, 49.17, 148, 158, 171–173
See application file for complete search history.

(56) References Cited

U.S. PATENT DOCUMENTS

| | | | |
|---|---|---|---|
| 7,675,765 B2 | 3/2010 | Derharcobian et al. | |
| 8,633,548 B2 | 1/2014 | Dhaoui et al. | |
| 9,189,732 B2 * | 11/2015 | Bichler | ................... G06N 3/049 |
| 9,362,337 B1 * | 6/2016 | Wu | ....................... H01L 27/2436 |
| 2010/0177560 A1 | 7/2010 | McElheny et al. | |
| 2014/0292368 A1 * | 10/2014 | Nazarian | ............... H01L 27/101 326/16 |
| 2015/0371705 A1 * | 12/2015 | Onkaraiah | ......... G11C 13/0007 327/208 |

(Continued)

*Primary Examiner* — Hien Nguyen
(74) *Attorney, Agent, or Firm* — CKC & Partners Co., Ltd.

(57) ABSTRACT

A non-volatile memory device includes plural non-memory cells. Each non-volatile memory cell includes a first switch, a first memristor, a second switch, a second memristor and a third switch. The control terminal of the first switch is coupled to a word line. The first memristor is provided with a first impedance. The control terminal of the second switch is coupled to the word line. The second memristor is provided with a second impedance. The first switch, the first memristor, the second switch and the second memristor are serially connected between a bit line and an inverted bit line in an alternate manner. The third switch is used for configuring the first impedance and the second impedance. The non-volatile memory device provided by the disclosure has a characteristic of quick access and the data stored therein does not require a dynamic update.

18 Claims, 8 Drawing Sheets

(56) References Cited

U.S. PATENT DOCUMENTS

2016/0012886 A1* 1/2016 Nazarian .............. G11C 13/004
                                                                              365/148
2016/0189775 A1* 6/2016 Buchanan .......... G11C 13/0059
                                                                               257/4

* cited by examiner

NON-VOLATILE MEMORY DEVICE WITH MEMRISTOR

RELATED APPLICATIONS

This application claims priority to Chinese Application Serial Number 201510412644.6 filed on Jul. 14, 2015, which is herein incorporated by reference.

BACKGROUND

Field of Invention

The disclosure relates to memory architecture, particularly to non-volatile memory architecture and a related circuit thereof.

Description of Related Art

The memory is an important constitute component of the electronic computer, and with the varying of application situations, various different memory architectures have been developed. The memory architecture is for example a dynamic random access memory (DRAM), a static random-access memory (SRAM), a read-only memory (ROM), a flash memory and the like.

The ROM and the flash memory pertain to the non-volatile memory which can record the data stored therein after a device is powered down. Generally, the aforementioned two non-volatile memories are relatively stable and power-saving for data storage, but cannot be overwritten easily and have relatively slow writing and reading speeds.

The volatile memory, such as the DRAM and the SRAM, is usually used as a main memory used together with a processor due to its relatively fast reading and writing speed. The DRAM has advantages of simple structure (only requiring a transistor and a capacitor), high storage density and low cost per cell capacity. In practice, the capacitance of the DRAM is often charged periodically, which results in a disadvantage of large power consumption.

Compared to DRAM, the data stored in SRAM can be remained constantly as long as the SRAM is powered on, without requiring a periodic charging of the capacitor. Furthermore, the SRAM generally has relatively faster reading and writing speeds (faster than the DRAM). However, in general, the architecture of SRAM generally needs six (or more) transistors to store one byte data, which requires higher manufacturing cost and occupies relatively large circuit space. Furthermore, when the power supply is cut off, the data stored in a conventional SRAM will still disappear.

As mobile devices getting thinning and lightening, the space on an electronic device is extremely limited, and the power consumption problem of the elements gains more attention. Therefore, there is a need of an appropriate memory capable of providing higher data stability, lower power consumption, a simple structure, and faster reading and writing speed.

SUMMARY

Recently, with the dimensions of current memories facing physical limitations, it is important to develop new memory techniques, wherein a memristive memory is widely studied due to its advantages of simple structure, low power consumption and the like. In order to solve the aforementioned problems, the disclosure provides a memristor-based non-volatile memory device which can be applied in various integrated circuits (e.g., a switch of a programmable circuit, or a content addressable memory). The non-volatile memory device of the disclosure has a characteristic of fast reading and writing which is similar to that of the SRAM. The non-volatile memory device does not to dynamically update the data stored therein, and, has a relatively simple structure and can store the data by using a memristor after the power is cut off.

An aspect of the disclosure provides a non-volatile memory device including a plurality of non-volatile memory cells. Each of the non-volatile memory cells is used for storing data of one bit. Each non-volatile memory cell is respectively coupled to a bit line, an inverted bit line and a word line. Each non-volatile memory cell includes a first switch, a first memristor, a second switch, a second memristor and a third switch. The control terminal of the first switch is coupled to the word line. The first memristor is configured as having a first impedance. The control terminal of the second switch is coupled to the word line. The second memristor is configured as having a second impedance. The first switch, the first memristor, the second switch and the second memristor are serially connected between a bit line and an inverted bit line in an alternate manner. The third switch is used for configuring the first impedance of the first memristor, and configuring the second impedance of the second memristor.

Another aspect of the disclosure provides a programmable circuit including a configuration switch and the non-volatile memory cell of the aforementioned aspect. An intermediate node of the first switch, the first memristor, the second switch and the second memristor is used for controlling the control terminal of the configuration switch.

A further aspect of the disclosure provides a content addressable memory including a comparison line, a pre-charge and sense amplifier, a comparison switch and a non-volatile memory cell mentioned in the aforementioned aspect. The pre-charge and sense amplifier is coupled to the comparison line, and is used for pre-charging the comparison line to a pre-charge potential and sensing the voltage level of the comparison line. The first end of the comparison switch is coupled to the comparison line, and the second end of the comparison switch is grounded. An intermediate node of the first switch, the first memristor, the second switch and the second memristor is used for controlling the control terminal of the comparison switch.

In view of the above, compared with the prior art, the technical solution of the disclosure has obvious advantages and beneficial effects. With the aforementioned technical solution, a considerable technical progress can be achieved and has the value of being widely applied in the industry. Each non-volatile memory cell of the disclosure only needs three transistor switches and two memristors to achieve a static random-access memory (SRAM) with a non-volatile characteristic, being applicable in various programmable circuit or memory circuit applications.

BRIEF DESCRIPTION OF THE DRAWINGS

The invention can be more fully understood by reading the following detailed description of the embodiment, with reference made to the accompanying drawings as follows.

DETAILED DESCRIPTION

The present invention will be described in details in the following embodiments with reference to the accompanying drawings. However, the embodiments described are not intended to limit the present invention. Moreover, it is not intended for the description of operation to limit the order of implementation. Any device with equivalent functions that is produced from a structure formed by a recombination of elements shall fall within the scope of the invention. Furthermore, according to industrial standards and conventional practices, the drawings are illustrated only for purpose of auxiliary illustration and are not drawn to scale. Actually, the size of various features can be increased or decreased arbitrarily for ease of illustration. For convenience of understanding, the same reference numbers represents the same elements in the following description.

Furthermore, as used herein the phrases "include", "comprise", "have", "contain" are all open phrases, meaning "including but not limited to". Furthermore, as used herein the phrase "and/or" includes any of one or more listed related items, and a combination thereof.

Herein, when it is said that one element is "connected" or "coupled", it refers to "electrically connected" or "electrically coupled". The "connected" or "coupled" can also be used for representing that two or more elements are operating cooperatively or interacting with each other. Furthermore, although as used herein the phrases "first", "second" and the like are used for describing different elements, these phrases are only used for distinguishing elements or operations described with the same technical words.

Figure 1:
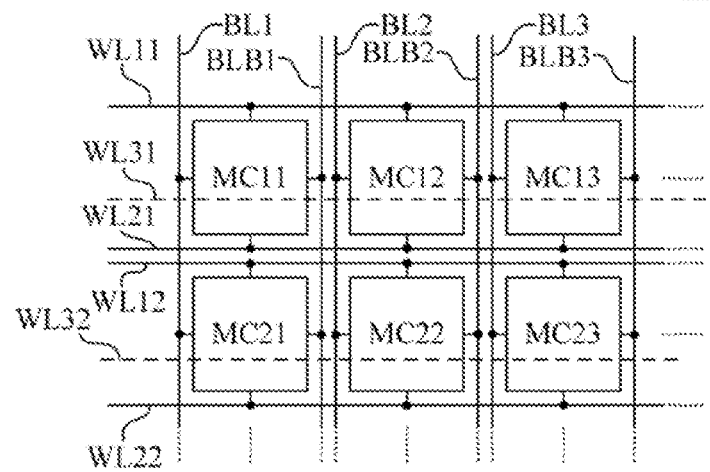
FIG. 1 is a schematic view of a non-volatile memory device illustrated according to an embodiment of the disclosure.

Referring to FIG. 1, it is a schematic view of a non-volatile memory device 100 according to an embodiment of the disclosure. As shown in FIG. 1, the non-volatile memory device 100 includes a plurality of non-volatile memory cells. Each of non-volatile memory cells is used for storing data of one bit. In FIG. 1 schematically illustrated are six non-volatile memory cells MC11, MC12, MC13, MC21, MC22 and MC23, although the disclosure is not limited to this. In actual application, the non-volatile memory device 100 may include multiple non-volatile memory cells. For example, a non-volatile memory device 100 of one Megabyte includes $2^{23}$ (8*1024*1024) non-volatile memory cells. The six non-volatile memory cells depicted in the drawings are only for ease of illustration. It should be noted that the number of memory cell arrays, and the number of word lines and memory cells corresponding to respective memory cell arrays can be adjusted according to actual demands. The number of elements depicted in FIG. 1 is only used as an example rather than limiting the disclosure. Additionally, the non-volatile memory cell described in the disclosure includes a phase change memory (PCM) element, a magneto-resistive random-access memory (MRAM) element, a resistive random-access memory (RRAM) element, a ferro-electric random access memory (FRAM) element, or other equivalent memory elements.

The non-volatile memory cells MC11-MC23 are respectively coupled to respective word lines WL11-WL12, reference potential lines WL21-WL22, configuration control lines WL31-WL32, bit lines BL1-BL3, and inverted bit lines/bit line bars BLB1-BLB3. For example, the non-volatile memory cell MC11 is coupled to the corresponding word line WL11, the corresponding reference potential line WL21, the corresponding configuration control line WL31, the corresponding bit line BL1 and the corresponding inverted bit line BLB1; the non-volatile memory cell MC12 located in the next bit under the same character is coupled to the corresponding word line WL11, the corresponding reference potential line WL21, the corresponding configuration control line WL31, the corresponding bit line BL2 and the corresponding inverted bit line BLB2; and the non-volatile memory cell MC21 located in the next row is coupled to the corresponding word line WL12, the corresponding reference potential line WL22, the corresponding configuration control line WL32, the corresponding bit line BL1 and the corresponding inverted bit line BLB1, and so on.

In this embodiment, the non-volatile memory cells MC11, MC12 and MC13 belong to the same character, and thus are coupled to the word line WL11, the reference potential line WL21 and the configuration control line WL31 of the same group. In the practical application, the same character may include 8 bytes, 16 bytes, 32 bytes, 64 bytes, 128 bytes or more (not shown). The other basic architectures of the aforementioned memory are well known to those of skills in the art, and thus the description thereof is not repeated herein. The word lines WL11-WL12 are used for controlling a first switch SW1 and a second switch SW2 of respective non-volatile memory cells MC11-MC23. The configuration control lines WL31-WL32 are used for controlling a third switch SW3 of respective non-volatile memory cells MC11-MC23.

Figure 2:
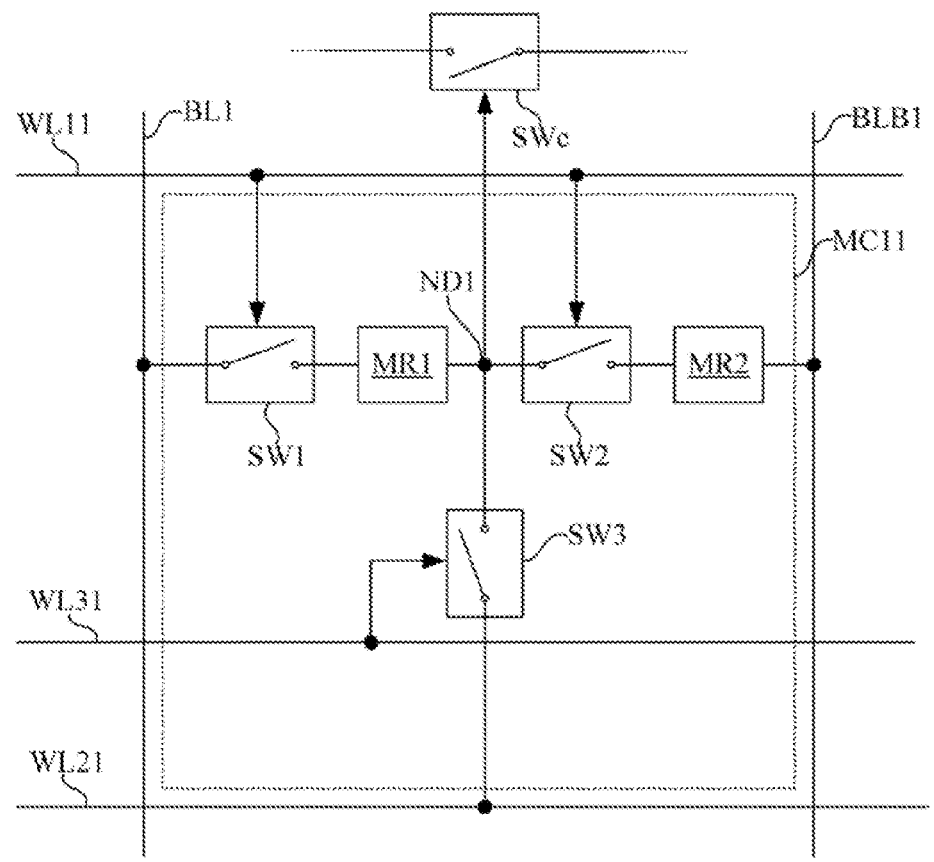
FIG. 2 illustrates a further schematic view of one non-volatile memory cell in the non-volatile memory device of FIG. 1.

Also Referring to FIG. 2, it illustrates a further schematic view of the non-volatile memory cell MC11 in the non-volatile memory device 100 of FIG. 1. In this embodiment, each of the non-volatile memory cells MC11-MC23 of FIG. 1 includes a detailed structure similar to that of the non-volatile memory cell MC11 of FIG. 2, and are equipped with respective signal lines (the bit line, the inverted bit line, the word line, the reference potential line, the configuration control line and the like).

As shown in FIG. 2, the non-volatile memory cell MC11 includes the first switch SW1, a first memristor MR1, the second switch SW2, a second memristor MR2, and the third switch SW3.

The memristor utilized as the first memristor MR1 and the second memristor MR2 is a passive electronic element. For example, if a phase change material (PCM) element is used, during the cooling and annealing process, according to the applied writing voltages and currents, the lattices of the PCM element is melted and configured to be of different crystal orientations, which makes the phase-changing materials have different impedances. When used in a non-volatile memory, the PCM element is generally configured to be in a high or low impedance state. The larger impedance ratio between the high impedance state and the low impedance state is the better, wherein the impedance ratio is generally greater than 5, and is preferably greater than 10. In this embodiment, the first memristor MR1 is configured to have a first impedance. The second memristor MR2 is configured to have a second impedance. The first impedance and the second impedance are different and logical complementary to each other. That is, one of the first memristor MR1 and the second memristor MR2 in the same non-volatile memory cell MC11 is in the high impedance state, and the other is in the low impedance state.

With the impedance difference between the first memristor MR1 and the second memristor MR2, the non-volatile memory cell MC11 stores data of one bit, wherein the data of the bit reveals the voltage level of the intermediate node ND1 of the non-volatile memory cell MC11. In an embodiment, the intermediate node ND1 is further coupled to a configuration switch SWc. As such, the voltage level of the intermediate node ND1 (i.e., the bit data stored in the non-volatile memory cell MC11) can be used for controlling the on-off state of the configuration switch SWc.

As shown in FIG. 2, the first switch SW1, the first memristor MR1, the second switch SW2 and the second memristor MR2 are serially connected in sequence between the bit line BL1 and the inverted bit line BLB1. The first end of the third switch SW3 (the upper input/output end of the third switch SW3, as shown in the figure) is coupled between the first memristor MR1 and the second switch SW2; the second end of the third switch SW3 (the lower input/output end of the third switch SW3, as shown in the figure) is coupled to the reference potential line WL21; and the control terminal of the third switch SW3 is coupled to the configuration control line WL31.

The first end of the first switch SW1 (the left-side input/output end of the first switch SW1, as shown in the figure) is coupled to the bit line BL1; the control terminal of the first switch SW1 is coupled to the word line WL11; the second end of the first switch SW1 (the right-side input/output end of the first switch SW1, as shown in the figure) is coupled to the first end of the first memristor MR1 (the left-side input/output end of the first memristor MR1, as shown in the figure); the second end of the first memristor MR1 (the right-side input/output end of the first memristor MR1, as shown in the figure) is coupled to the first end of the second switch SW2 (the left-side input/output end of the second switch SW2, as shown in the figure) and the first end of the third switch SW3; the control terminal of the second switch SW2 is coupled to the word line WL11; the second end of the second switch SW2 (the right-side input/output end of the second switch SW2, as shown in the figure) is coupled to the first end of the second memristor MR2 (the left-side input/output end of the second memristor MR2, as shown in the figure); and the second end of the second memristor MR2 (the right-side input/output end of the second memristor MR2, as shown in the figure) is coupled to the inverted bit line BLB1.

In the embodiment as shown in FIG. 2, the non-volatile memory cell MC11, which only includes three switching elements (the first switch SW1, the second switch SW2 and the third switch SW3) and two memristive elements (the first memristor MR1 and the second memristor MR2), can form a read-write non-volatile memory device. Also, the read-write non-volatile memory device owns both characteristics of a static random-access memory (SRAM), which has fast reading and writing speeds, and a flash memory, the data of which can be updated. Therefore, the read-write non-volatile memory device has a relatively simple structure, and can use the memristor to store the data content after the power is cut off.

In the embodiment as shown in FIG. 2, when it is wanted to read the data stored in the non-volatile memory cell MC11, the word line WL11 is controlled to turn on the first switch SW1 and the second switch SW2, and the configuration control line WL31 is controlled to turn off the third switch SW3. At this time, the first memristor MR1 and the second memristor MR2 form a resistive voltage divider, and the voltage of the intermediate node ND1 controls the on/off state of the configuration switch SWc. If the first memristor MR1 is configured to a high impedance state and the second memristor MR2 is configured to a low impedance state, then when the bit line BL1 is at high potential (logic "1") and the inverted bit line BLB1 is at low potential (logic "0"), the voltage of the intermediate node ND1 approaches the low potential, wherein the larger the impedance ratio between the high impedance state and the low impedance state is, the closer the voltage of the intermediate node ND1 approaches the low voltage of the inverted bit line BLB1. In contrast, if the first memristor MR1 is configured to a low impedance state and the second memristor MR2 is configured to a high impedance state, then the voltage of the intermediate node ND1 approaches the high potential of the bit line BL1. In another case that the bit line BL1 is at low potential (logic "0") and the inverted bit line BLB1 is at high potential (logic "1"), when the first memristor MR1 is configured to a high impedance state and the second memristor MR2 is configured to a low impedance state, the voltage of the intermediate node ND1 approaches the high voltage of the inverted bit line BLB1. In contrast, if the first memristor MR1 is configured to a low impedance state and the second memristor MR2 is configured to a high impedance state, then the voltage of the intermediate node ND1 approaches the low voltage of the bit line BL1. The on or off state of the configuration switch SWc is controlled by the voltage of the intermediate node ND1. In an embodiment, if the configuration switch SWc is a N-type metal-oxide semiconductor (NMOS), then the high voltage of the intermediate node ND1 turns on the configuration switch SWc, and the low voltage of the intermediate node ND1 turns off the configuration switch SWc. In another embodiment, if the configuration switch SWc is a P-type metal-oxide semiconductor (PMOS), then the low voltage of the intermediate node ND1 turns on the configuration switch SWc, and the high voltage of the intermediate node ND1 turns off the configuration switch SWc. Furthermore, the detailed operations of writing into the first memristor MR1 and the second memristor MR2 will be described in details in subsequent paragraphs (e.g., the subsequent paragraphs related to the embodiments of FIG. 6A and FIG. 6B).

Figure 3:
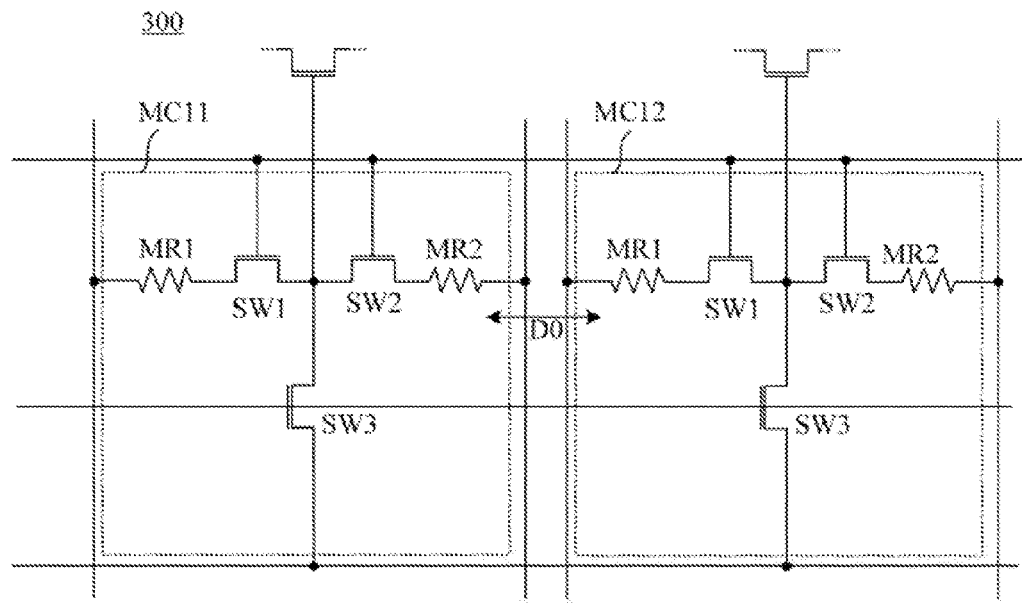
FIG. 3 illustrates a schematic view of two adjacent non-volatile memory cells in another non-volatile memory device.

It should be specifically illustrated that during actual manufacturing of the non-volatile memory device, in the circuit layout, the two memristors (such as the phase change memory (PCM) element, the magneto-resistive random-access memory (MRAM) element, the resistive random-access memory (RRAM) element, the ferroelectric random access memory (FRAM) element, and the like) should be spaced apart from each other by a certain distance. Taking the PCM element as an example, if the distance between the two PCM elements are too close, then the heat generated by writing into one of the PCM elements would affect the crystal orientation of the other one of PCM elements, thereby causing the information stored in the PCM elements invalid. Besides, if the distance between the two PCM elements is too close, during reading/writing, the signals of the two elements would be affected by each other, and it will reduce the stability of the signals. In the conventional practice, it stipulates that in the circuit layout, the two adjacent PCM elements should be spaced out a minimum distance apart. Therefore, in some conventional memory architectures, if there is a circuit layout having two adjacent PCM elements, it is needed to add a redundant space between the two PCM elements. Also referring to FIG. 3, it illustrates a schematic view of two adjacent non-volatile memory cells MC11 and MC12 in another non-volatile memory device 300. As shown in FIG. 3, in the non-volatile memory cell MC11, the first memristor MR1, the first switch SW1, the second switch SW2 and the second memristor MR2 are sequentially connected in series. The first memristor MR1 and the second memristor MR2 are disposed at the outer side, and the first switch SW1 and the second switch SW2 are disposed at the inner side. In this way, the second memristor MR2 in the non-volatile memory cell MCI 11 will be adjacent to the first memristor MR1 in the next non-volatile memory cell MC12.

Taking the PCM element as an example, if contact points of two memristors are too close to each other, the voltage pulse of setting one memristor would affect the other memristor. Therefore, in the standard circuit layout design, the contact points of the two memristors should be spaced out a minimum distance apart. As shown in FIG. 3, in a real circuit layout, the second memristor MR2 of the non-volatile memory cell MC11 and the first memristor MR1 of the non-volatile memory cell MC12 should be spaced out a minimum distance D0 apart, wherein if the distance is too small, the accuracy of the memristors will be affected. However, in order to comply with the standard of minimum spaced distance D0, the two non-volatile memory cells MC11 and MC12 in the non-volatile memory device 300 cannot be disposed closely, which reduces the chip utilization rate per unit area.

Figure 4A:
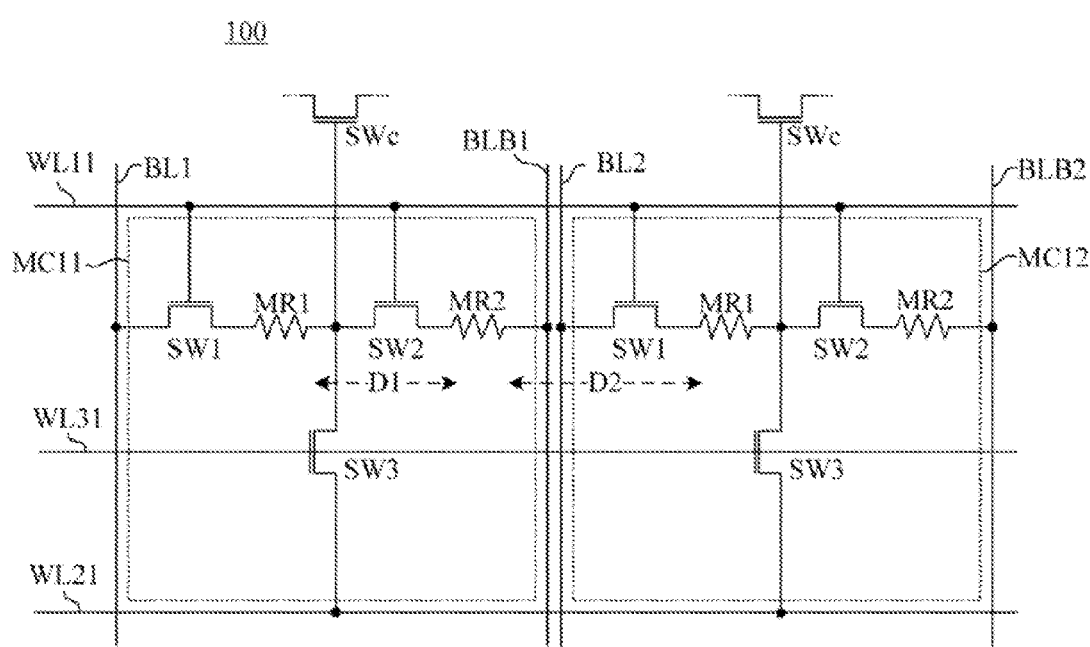
FIG. 4A illustrates a schematic view of one non-volatile memory cell and another non-volatile memory cell adjacent thereto in the non-volatile memory device of FIG. 1 according to the disclosure.

Also referring to FIG. 4A, it illustrates a schematic view of one non-volatile memory cell MC11 and another adjacent non-volatile memory cell MC12 in the non-volatile memory device 100 of FIG. 1 according to the disclosure. Regarding the circuit layout of the disclosure, in non-volatile memory cell MC11, the first memristor MR1, the first switch SW1, the second memristor MR2 and the second switch SW2 are sequentially disposed.

That is, in the non-volatile memory cell MC11, the second switch SW2 is disposed between the first memristor MR1 and the second memristor MR2. Therefore, the second switch SW2 is the space disposed between the first memristor MR1 and the second memristor MR2, which effectively utilizes the space on the circuit (without wasting the space of the distance D0 between the two memristors MR1 and MR2 as shown in FIG. 3) and ensures that the two memristors are spaced out a spaced distance D1 apart.

Moreover, the first switch SW1 of the non-volatile memory cell MC12 is disposed between the second memristor MR2 of the non-volatile memory cell MC11 and the first memristor MR1 of the non-volatile memory cell MC12. In an embodiment, the inverted bit line BLB1 of the memory cell MC11 and the bit line BL2 of the memory cell MC12 are shared (not shown). In such a case, the first switch SW1 of the non-volatile memory cell MC12 is disposed between the second memristor MR2 of the non-volatile memory cell MC11 and the first memristor MR1 of the non-volatile memory cell MC12, and the first switch SW1 of the non-volatile memory cell MC12 is disposed in the spaced distance D2 between the aforementioned two memristors, without additionally wasting the space of the spacing distance D0 between the two memristors MR1 and MR2 as shown in FIG. 3).

Figure 4B:
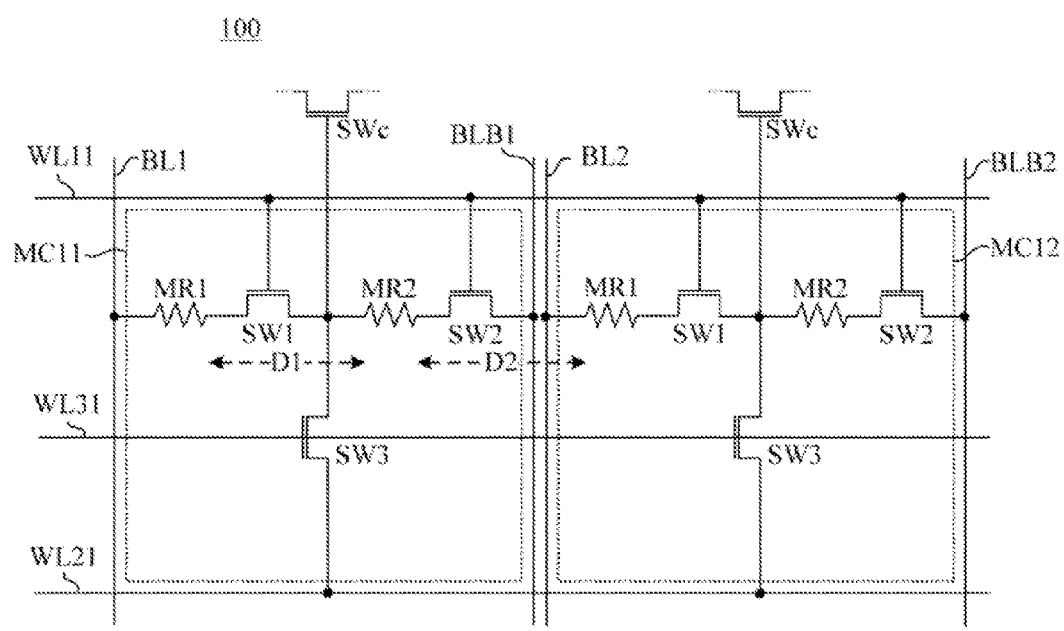
FIG. 4B illustrates a schematic view of one non-volatile memory cell and another non-volatile memory cell adjacent thereto in the non-volatile memory device of FIG. 1 according to the disclosure.

In another embodiment, as shown in FIG. 4B, positions of the switches SW1 and SW2 and the memristors MR1 and MR2 in FIG. 4A are interchanged, which can also achieve the same function of the embodiment of FIG. 4A. Thus, from the aforementioned embodiments of FIGS. 4A and 4B, it can be seen that the result of the disclosure can be achieved just by serially connecting the first switch SW1, the first memristor MR1, the second switch SW2 and the second memristor MR2 in an alternate manner. The alternate manner of serially connecting refers to that one switch and one memristor are alternately connected between the bit line BL1/BL2 and the inverted bit line BLB1/BLB2. For example, as embodiments shown in FIG. 4A, one switch, one memristor, one switch and one memristor are connected in series alternately from left to right, or as other embodiments shown in FIG. 4B, one memristor, one switch, one memristor and one switch are connected in series alternately from left to right.

As shown in FIGS. 1, 2, 4A and 4B, the non-volatile memory device 100 and the non-volatile memory cells MC11-MC23 thereof mentioned in the above embodiments can be applied to a programmable circuit. For example, the programmable circuit 400 is a field-programmable gate array (FPGA) circuit or a programmable logic device (PLD). The programmable circuit includes one or more configuration switches SWc.

As shown in FIGS. 1, 2, 4A and 4B, each of the non-volatile memory cells MC11-MC23 of the non-volatile memory device 100 can be used for controlling one of the configuration switches SWc of the programmable circuit according to the stored bit data, such that the programmable circuit can have different actions, functions or operation characteristics according to the data stored in the non-volatile memory device. For ease of illustration, FIG. 2 only illustrates one of the configuration switches SWc of the programmable circuit. In actual application, the programmable circuit may further have multiple configuration switches (respectively controlled by different non-volatile memory cells), digital processors, input/output interfaces, other active elements or passive elements, wherein these elements are known to those of skills in the art, and thus are not described any more herein.

As shown in FIGS. 2 and 4A, the control terminal of the configuration switch SWc of the programmable circuit is coupled to the second end of the first memristor MR1, the first end of the second switch SW2 and the first end of the third switch SW3. By the operation of reading the data stored in the non-volatile memory cell MC11 in the aforementioned embodiment, the on/off state of the configuration switch SWc can be controlled according to the high/low impedance state of the first memristor MR1 and the second memristor MR2, so as to set the configuration of the programmable circuit.

A conventional programmable circuit includes a built-in static random-access memory (SRAM). When the conventional programmable circuit is activated, configuration setting data are loaded from an external memory into the built-in SRAM, for setting the programmable circuit. The conventional programmable circuit requires extra space for implementing the built-in SRAM and extra time for downloading the configuration setting data from the external memory. In contrast, if the structure of non-volatile memory cell MC11 of the embodiment of the non-volatile memory device 100 of FIG. 1 is implemented in the programmable circuit, the memory device 100 memorizes the configuration to be set for the programmable circuit. When the programmable circuit is activated, the programmable circuit is set up according to the on/off state of the configuration switch SWc, which is a controlled switch representing the configuration setting data. In general, the configuration setting data of the programmable circuit are not required to update every time. The memristor records the configuration setting data for the programmable circuit while the programmable circuit is deactivated (power-off). The non-volatile memory device 100 is required to re-configure the impedance state of the memristor only when the configuration setting data are changed.

Figure 5A:
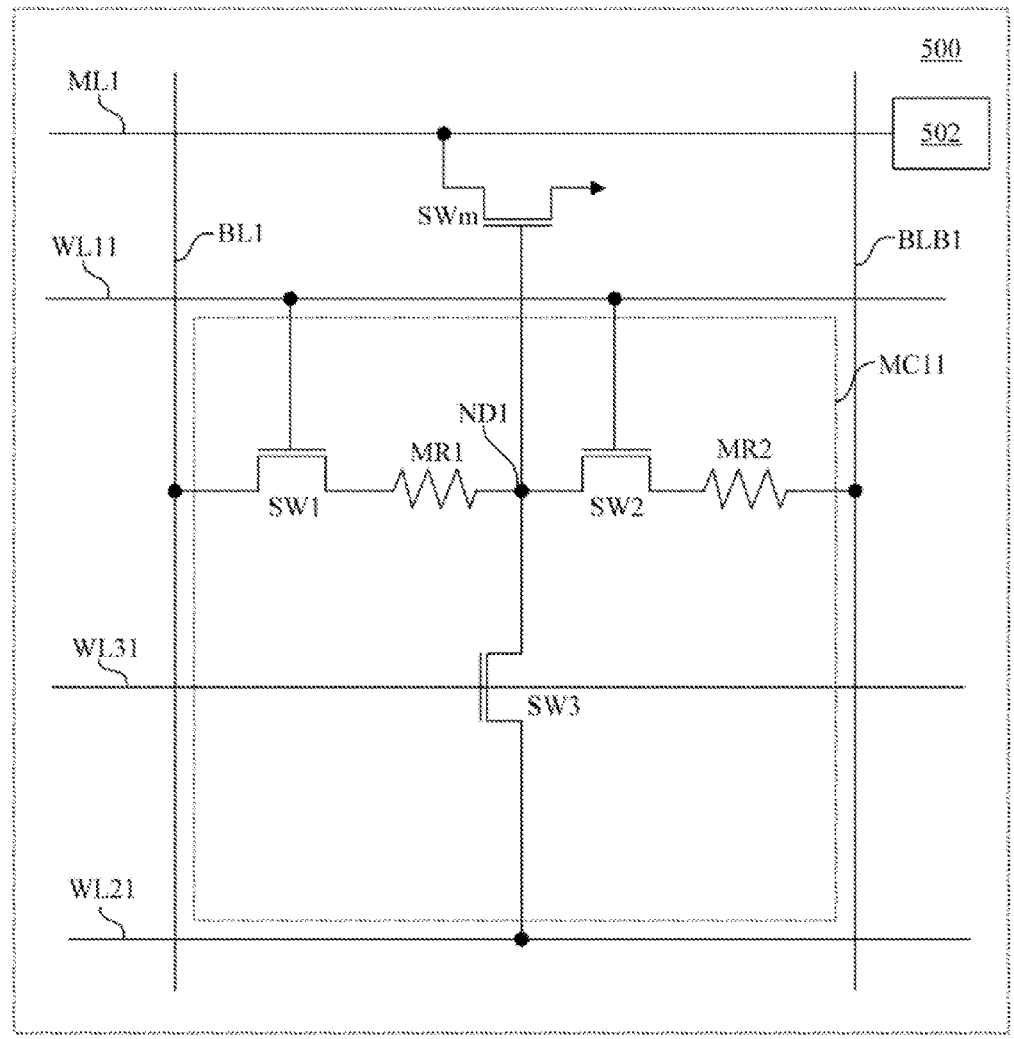
FIG. 5A illustrates a schematic view of the non-volatile memory cell of the aforementioned non-volatile memory device, wherein the non-volatile memory cell is applied in a content addressable memory according to an embodiment of the disclosure.

Also referring to FIG. 5A, it illustrates a schematic view of the non-volatile memory cell MC11 of the aforementioned non-volatile memory device according to an embodiment of the disclosure, wherein the non-volatile memory cell MC11 is applied to a content addressable memory (CAM) 500.

As shown in FIG. 5A, the content addressable memory 500 includes a comparison line ML1, a comparison switch SWm, and a pre-charge and sense amplifier 502. The pre-charge and sense amplifier 502 is coupled to the comparison line ML1, and the comparison line ML1 is coupled to one end of the comparison switch SWm. The content addressable memory 500 is characterized in that when the controller (not shown) of the content addressable memory 500 searches where the data with specific data content is (e.g., the specific data content of 8 bits is 10010010), the comparison line ML1 is pre-charged to a high potential first, and the aforementioned specific data content is set on the bit line/inverted bit line of each character. The memory address is varied one by one for comparison, wherein if the bit data desired to be read out externally complies with the data stored in the memory element, the comparison line ML1 is discharged to the low potential, otherwise the comparison line ML1 always keeps at the high potential. Through the aforementioned mechanism, the memory address of the data can be found.

Figure 5B:
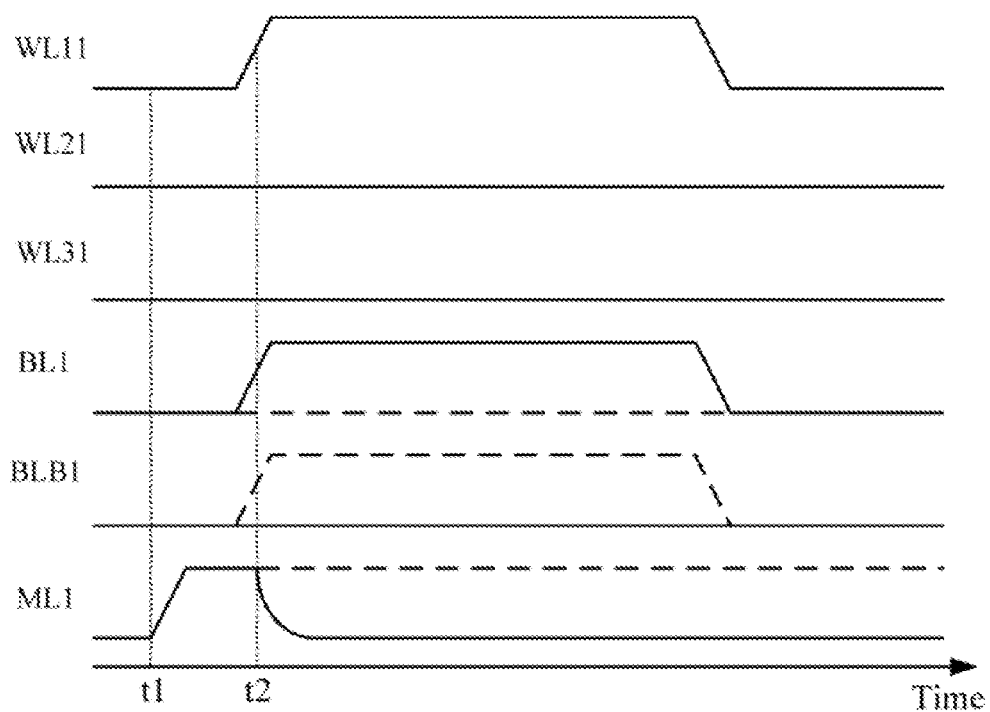
FIG. 5B illustrates a timing diagram of related signals when a comparison operation is performed by the content addressable memory.

One comparison manner of the memory cell is explained below according to FIGS. 5A and 5B, wherein if the high potential of the bit line BL1 or the inverted bit line BLB1 is defines as logic "1", then the low potential thereof is logic "0". In the memory cell 500, if the first memristor MR1 is set in low impedance and the second memristor MR2 is set in high impedance state, then the memory cell 500 is defined as storing logic "1". In contrast, if the first memristor MR1 is set in high impedance and the second memristor MR2 is set in low impedance, then the memory cell 500 is defined as storing logic "0".

In an embodiment, providing that in the non-volatile memory cell MC11 the first memristor MR1 is set in low impedance and the second memristor MR2 is set in high impedance, then the non-volatile memory cell MC11 stores logic "1". When the non-volatile memory cell MC11 is read, the third switch SW3 is cut off. At the time point t1, the comparison line ML1 is pre-charged to a high potential by the pre-charge and sense amplifier 502, and is floated. At the time point t2, a high potential is inputted into the word line WL11 to turn on the first switch SW1, the second switch SW2, the first memristor MR1 and the second memristor MR2, so as to form a resistive voltage divider. At this time, if the logic "1" is inputted into the bit line BL1 (at the high potential, as represented by the solid line of FIG. 5B) and the logic "0" is inputted into the inverted bit line BLB1 (at the low potential, as represented by the solid line of FIG. 5BB), then the voltage of the intermediate node ND1 approaches the high potential of the bit line BL1. In this case, the comparison switch SWm is turned on and the voltage of the comparison line is discharged to the low potential (as represented by the solid line of FIG. 5B), which is the case that the desired read-out logic "1" complies with the logic "1" of the bit data stored in the non-volatile memory cell MC11. In contrast, if the logic "0" is inputted into the bit line BL1 (at the low potential, as represented by the dashed line of FIG. 5B) and the logic "1" is inputted into the inverted bit line BLB1 (at the high potential, as represented by the dashed line of FIG. 5B), then the voltage of the intermediate node ND1 approaches the low potential of the bit line BL1. In this case the comparison switch SWm is not turned on and the voltage of the comparison line keeps at the high potential (as represented by the dashed line of FIG. 5B), which is the case that the desired read-out logic "0" does not comply with the logic "1" of the bit data stored in the non-volatile memory cell MC11.

In another embodiment, providing that in the non-volatile memory cell MC11 the first memristor MR1 is set in high impedance and the second memristor MR2 is set in low impedance, then the non-volatile memory cell MC11 stores logic "0". Based on the aforementioned working principle, when the data of the bit line BL1 is at the high potential and the inverted bit line BLB1 is at the low potential, the desired read-out bit data is logic "1". Since the desired read-out bit data does not comply with the data (logic "0") stored in the non-volatile memory cell MC11, the comparison line ML1 keeps at the high potential. In contrast, if the data of the bit line BL1 is at the low potential and the inverted bit line BLB1 is at the high potential, the desired read-out bit data is logic "0". Since the desired read-out bit data complies with the data (logic "0") stored in the non-volatile memory cell MC11, the comparison line ML1 is discharged to the low potential.

Furthermore, each of the non-volatile memory cells MC11-MC23 of FIG. 1 can be used for storing data of one bit and is suitable for applying to the content addressable memory 500. For ease of illustration, FIG. 5A only illustrates one non-volatile memory cell MC11, a pre-charge and sense amplifier 502 and the related signal lines of the content addressable memory 500. In a practical application, in addition to the configuration switch, the content addressable memory 500 may further have multiple bit non-volatile memory cells (referring to FIG. 1), controllers, pre-charge circuits, potential sensing circuits, digital processors, input/output interfaces, and other active or passive elements, wherein these elements are known to those of skills in the art, and thus are not described any more herein.

Figure 6A:
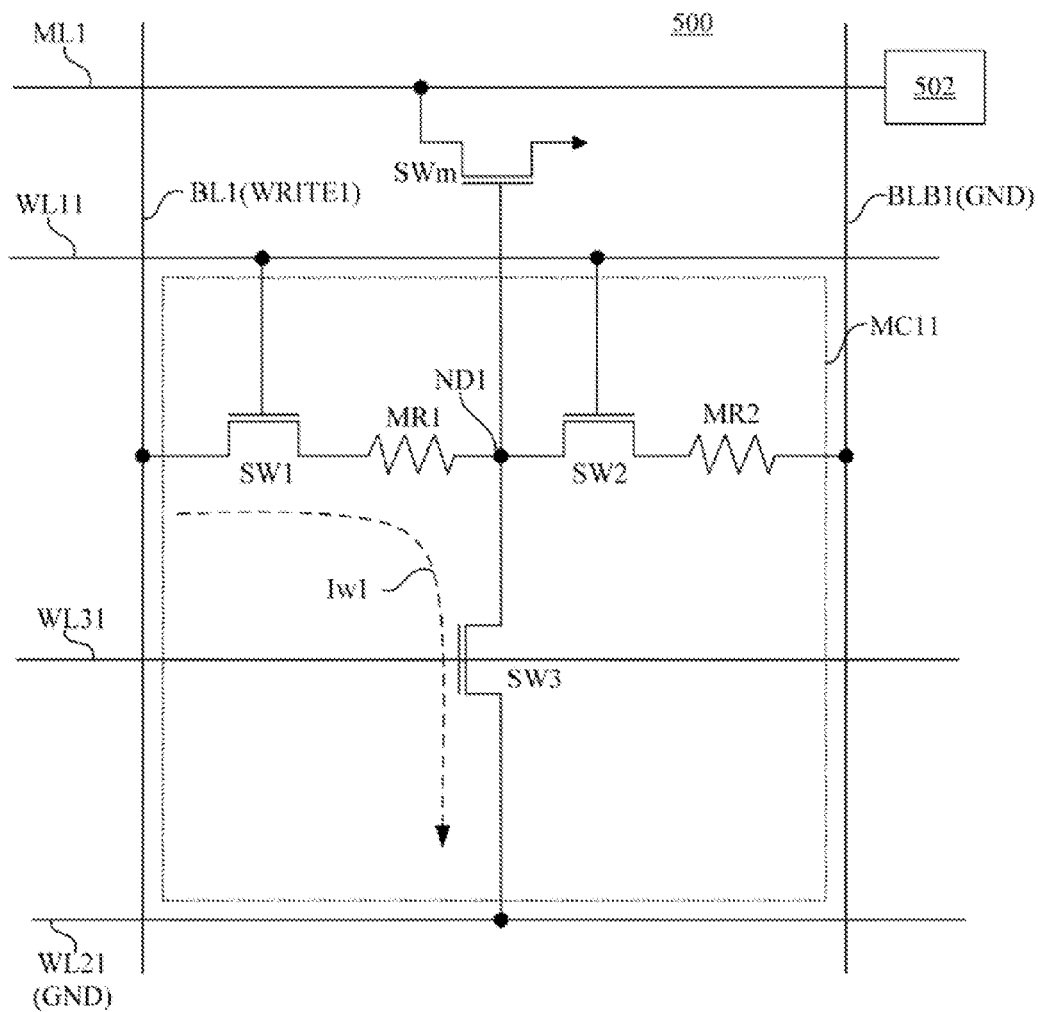
FIG. 6A and FIG. 6B illustrate schematic views of operations when a writing operation is performed to the data stored in the non-volatile memory cell.
Figure 6B:
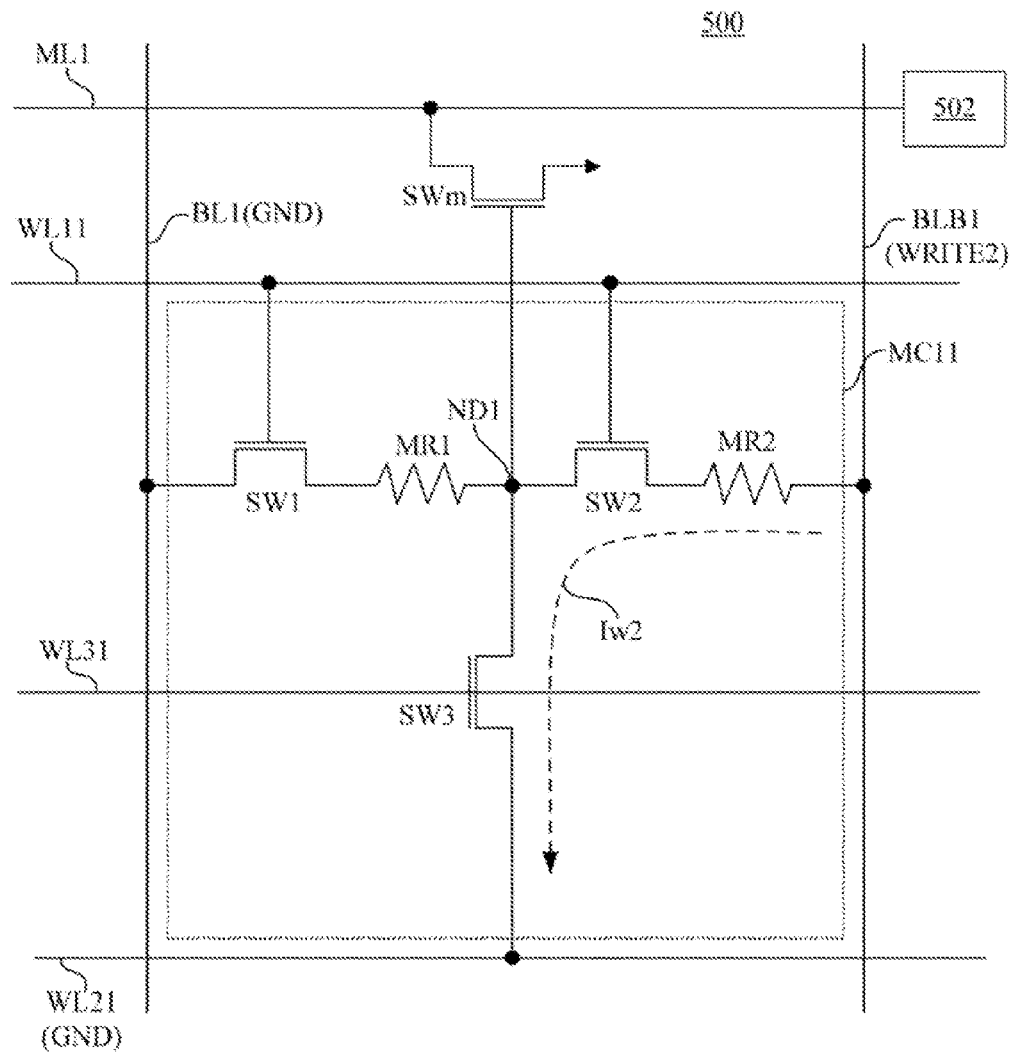
Figure 6C:
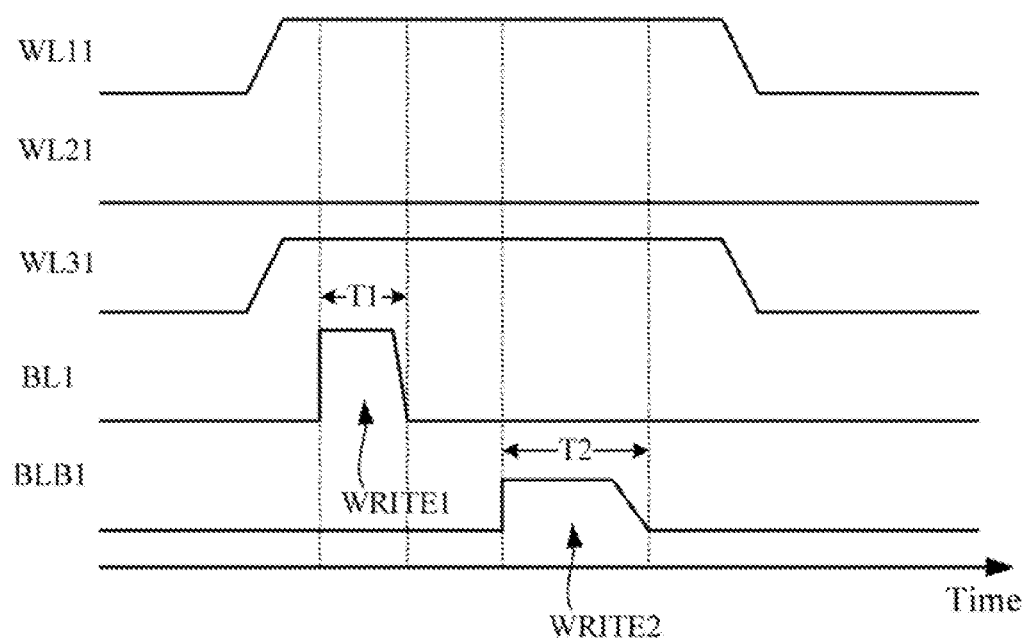
FIG. 6C illustrates a timing diagram of related signals when a writing operating is performed to the non-volatile memory cell.

Referring to FIGS. 6A, 6B and 6C at the same time, FIGS. 6A and 6B illustrate schematic views of operations when the non-volatile memory cell MC11 performs a writing operation to write the stored data. FIG. 6C illustrates a timing diagram of related signals when the non-volatile memory cell MC11 performs a writing operation.

As described above, the data stored in the non-volatile memory cell MC11 is defined by the high and low impedance states of the first memristor MR1 and the second memristor MR2.

Referring to FIGS. 6A and 6C, these diagrams illustrate the operation manner of writing data into the non-volatile memory 500. When a writing operation is performed on the first memristor MR1, the word line WL11 and the configuration control line WL31 are controlled to turn on the first switch SW1, the second switch SW2 and the third switch SW3. The reference potential line WL21 and the inverted bit line BLB1 are set at ground potential GND (e.g., 0 V), and, during the time period T1, a first write pulse WRITE1 is inputted from the bit line BL1. In this way, a write current Iw1, corresponding to the voltage difference between the bit line BL1 and the reference potential line WL21, is generated on the first memristor MR1. A writing operation is performed on the first memristor MR1, so as to accordingly change the impedance of the first memristor MR1.

As shown in FIG. 6B, when a writing operation is performed on the second memristor, the word line WL11 and the configuration control line WL31 are controlled to turn on the first switch SW1, the second switch SW2 and the third switch SW3. The reference potential line WL21 and the bit line BL1 are set at the ground potential GND (e.g., 0 V), and, during the second time period T2, a second write pulse WRITE2 is inputted from the inverted bit line BLB1. In this way, a write current Iw2, corresponding to the voltage difference between the inverted bit line BLB1 and the reference potential line WL21, is generated on the second memristor MR2. A writing operation is performed on the second memristor MR2, so as to accordingly change the impedance of the second memristor MR2.

It should be specifically illustrated that as shown in FIG. 6C, the first write pulse WRITE1 and the second write pulse WRITE2 are different from each other, and thus different write currents Iw1 and Iw2 are generated, so that the first memristor MR1 and the second memristor MR2 are respectively set at different impedances. For example, the first write pulse WRITE1, which is shorter and fast-changing, sets the first memristor MR1 to be high impedance; and the second write pulse WRITE2, which is longer and slow-changing, sets the second memristor MR2 to be low impedance, and vice versa. However, the relationship between the write pulse and the high/low impedance state in the disclosure is not limited to this, and the relationship is adaptively adjusted according to the native characteristics of the memristor element in actual application. The formats of the first write pulse WRITE1 and the second write pulse WRITE2 include current pulses (e.g., Iw1 or Iw2) or voltage pulses in some other embodiments.

Furthermore, the aforementioned writing operations performed on the first memristor MR1 and the second memristor MR2 are not limited to the application in the content addressable memory 50. Actually, various applications that need to change the data stored in the non-volatile memory cell MC11 (e.g., the non-volatile memory device 100 as shown in FIG. 1) can perform writing operations by the aforementioned manners.

Although the disclosure has been disclosed with reference to the above embodiments, these embodiments are not intended to limit the disclosure. Various modifications and variations can be made by those of skills in the art without departing from the spirit and scope of the present invention, for example by changing the numerical of the memory cell arrays or changing the number of word lines corresponding to various groups of memory cell arrays. Therefore, the claimed scope of the disclosure shall be defined by the appended claims.

What is claimed is:

1. A non-volatile memory device, comprising:
 a plurality of non-volatile memory cells, wherein each of the non-volatile memory cells is used for storing data of one bit, and each of the non-volatile memory cells is connected to a bit line, an inverted bit line and a word line respectively, and each of the non-volatile memory cells comprises:
  a first switch, wherein a control terminal of the first switch is coupled to the word line;
  a first memristor configured as having a first impedance;
  a second switch, wherein a control terminal of the second switch is coupled to the word line;
  a second memristor configured as having a second impedance, wherein the first switch, the first memristor, the second switch and the second memristor are serially connected in an alternate manner between the bit line and the inverted bit line; and
  a third switch used for configuring the first impedance of the first memristor and configuring the second impedance of the second memristor.

2. The non-volatile memory device of claim 1, wherein each of the non-volatile memory cells is further coupled to a reference potential line and a configuration control line, and each of the first switch, the second switch and the third switch has a first end, a second end and a control terminal, and each of the first memristor and the second memristor has a first end and a second end;
 wherein the alternate manner is that:
  the first end of the first switch is coupled to the bit line, the second end of the first switch is coupled to the first end of the first memristor, and the second end of the first memristor is coupled to an intermediate node;
  the first end of the second switch is coupled to the intermediate node, and the second end of the second switch is coupled to the first end of the second memristor; and
  the second end of the second memristor is coupled to the inverted bit line.

3. The non-volatile memory device of claim 2, wherein the first end of the third switch is coupled to the intermediate node, the second end of the third switch is coupled to the reference potential line, and the control terminal of the third switch is coupled to the configuration control line.

4. The non-volatile memory device of claim 3, wherein when the first memristor and the second memristor are configured, the word line and the configuration control line turn on the first switch, the second switch and the third switch, and the reference potential line is configured at a low voltage level,
 when the inverted bit line is configured at a low voltage level, a first write pulse is generated from the bit line so as to configure the first memristor at the first impedance; and
 when the bit line is configured at a low voltage level, a second write pulse is generated from the inverted bit line so as to configure the second memristor at the second impedance.

5. The non-volatile memory device of claim 4, wherein formats of the first write pulse and the second write pulse comprises a voltage pulse or a current pulse.

6. The non-volatile memory device of claim 3, wherein when the word line turns on the first switch and the second switch, the first memristor and the second memristor between the bit line and the inverted bit line form a resistive voltage divider, and a divided voltage result of the resistive voltage divider is outputted from the intermediate node.

7. The non-volatile memory device of claim 1, wherein each of the non-volatile memory cells is further coupled to a reference potential line and a configuration control line, and each of the first switch, the second switch and the third switch has a first end, a second end and a control terminal, and each of the first memristor and the second memristor has a first end and a second end;
 wherein the alternate manner is that:

the first end of the first memristor is coupled to the bit line, the second end of the first memristor is coupled to the first end of the first switch, and the second end of the first switch is coupled to an intermediate node;

the first end of the second memristor is coupled to the intermediate node, and the second end of the second memristor is coupled to the first end of the second switch; and the second end of the second switch is coupled to the inverted bit line.

8. The non-volatile memory device of claim 7, wherein the first end of the third switch is coupled to the intermediate node, the second end of the third switch is coupled to the reference potential line, and the control terminal of the third switch is coupled to the configuration control line.

9. The non-volatile memory device of claim 8, wherein when the first memristor and the second memristor are configured, the word line and the configuration control line turn on the first switch, the second switch and the third switch, and the reference potential line is configured at a low voltage level, when the inverted bit line is configured at a low voltage level, a first write pulse is generated from the bit line so as to configure the first memristor at the first impedance; and when the bit line is configured at a low voltage level, a second write pulse is generated from the inverted bit line so as to configure the second memristor at the second impedance.

10. The non-volatile memory device of claim 9, wherein formats of the first write pulse and the second write pulse comprises a voltage pulse or a current pulse.

11. The non-volatile memory device of claim 8, wherein when the word line turns on the first switch and the second switch, the first memristor and the second memristor between the bit line and the inverted bit line form a resistive voltage divider, and a divided voltage result of the resistive voltage divider is outputted by the intermediate node.

12. The non-volatile memory device of claim 1, wherein the first impedance and the second impedance are different and logically complementary to each other, and if the first impedance is high impedance, then the second impedance is low impedance, while if the first impedance is low impedance, then the second impedance is high impedance.

13. A programmable circuit, comprising:
a configuration switch comprising a control end;
a non-volatile memory device for controlling the configuration switch, wherein the non-volatile memory device comprises:
a plurality of non-volatile memory cells each used for storing data of one bit, wherein each of the non-volatile memory cells is connected to a bit line, an inverted bit line and a word line respectively, and each of the non-volatile memory cells comprises:
a first switch, wherein a control terminal of the first switch is coupled to the word line;
a first memristor configured as having a first impedance;
a second switch, wherein a control terminal of the second switch is coupled to the word line;
a second memristor configured as having a second impedance, wherein the first switch, the first memristor, the second switch and the second memristor are serially connected in an alternate manner between the bit line and the inverted bit line; and a third switch used for configuring the first impedance of the first memristor and configuring the second impedance of the second memristor.

14. The programmable circuit of claim 13, wherein each of the non-volatile memory cells is further coupled to a reference potential line and a configuration control line, and each of the first switch, the second switch and the third switch has a first end, a second end and a control terminal, and each of the first memristor and the second memristor has a first end and a second end, wherein the alternate manner is that:
the first end of the first switch is coupled to the bit line, the second end of the first switch is coupled to the first end of the first memristor, and the second end of the first memristor is coupled to an intermediate node, the intermediate node is used for controlling the control terminal of the configuration switch;

the first end of the second switch is coupled to the intermediate node, and the second end of the second switch is coupled to the first end of the second memristor; and the second end of the second memristor is coupled to the inverted bit line;

wherein the intermediate node controls the control end of the configuration switch.

15. The programmable circuit of claim 13, wherein each of the non-volatile memory cells is further coupled to a reference potential line and a configuration control line, and each of the first switch, the second switch and the third switch has a first end, a second end and a control terminal, and each of the first memristor and the second memristor has a first end and a second end;

wherein the alternate manner is that:
the first end of the first memristor is coupled to the bit line, the second end of the first memristor is coupled to the first end of the first switch, and the second end of the first switch is coupled to an intermediate node, the intermediate node is used for controlling the control terminal of the configuration switch;

the first end of the second memristor is coupled to the intermediate node, and the second end of the second memristor is coupled to the first end of the second switch; and the second end of the second switch is coupled to the inverted bit line;

wherein the intermediate node controls the control end of the configuration switch.

16. A content addressable memory, comprising:
a comparison line;
a pre-charge and sense amplifier coupled to the comparison line, wherein the pre-charge and sense amplifier is used for pre-charging the comparison line to a pre-charge potential and sensing the voltage level of the comparison line;
a comparison switch having a first end, a second and a control end, wherein the first end of the comparison switch is coupled to the comparison line, and the second end of the comparison switch is grounded; and
a non-volatile memory device configured for controlling a control terminal of the comparison switch, wherein the non-volatile memory device comprises:
a plurality of non-volatile memory cells each used for storing data of one bit, wherein each of the non-volatile memory cells is connected to a bit line, an inverted bit line and a word line respectively, and each of the non-volatile memory cells comprises:

a first switch, wherein a control terminal of the first switch is coupled to the word line;

a first memristor configured as having a first impedance;

a second switch, wherein a control terminal of the second switch is coupled to the word line;

a second memristor configured as having a second impedance, wherein the first switch, the first memristor, the second switch and the second memristor are serially connected in an alternate manner between the bit line and the inverted bit line; and a third switch used for configuring the first impedance of the first memristor and configuring the second impedance of the second memristor.

17. The content addressable memory of claim 16, wherein each of the non-volatile memory cells is further coupled to a reference potential line and a configuration control line, and each of the first switch, the second switch and the third switch has a first end, a second end and a control terminal, and each of the first memristor and the second memristor has a first end and a second end;

wherein the alternate manner is that:

the first end of the first switch is coupled to the bit line, the second end of the first switch is coupled to the first end of the first memristor, and the second end of the first memristor is coupled to an intermediate node, the intermediate node is used for controlling the control terminal of the comparison switch;

the first end of the second switch is coupled to the intermediate node, and the second end of the second switch is coupled to the first end of the second memristor; and the second end of the second memristor is coupled to the inverted bit line;

wherein the intermediate node controls the control end of the comparison switch.

18. The content addressable memory of claim 16, wherein each of the non-volatile memory cells is further coupled to a reference potential line and a configuration control line, and each of the first switch, the second switch and the third switch has a first end, a second end and a control terminal, and each of the first memristor and the second memristor has a first end and a second end;

wherein the alternate manner is that:

the first end of the first memristor is coupled to the bit line, the second end of the first memristor is coupled to the first end of the first switch, and the second end of the first switch is coupled to an intermediate node, the intermediate node is used for controlling the control terminal of the comparison switch;

the first end of the second memristor is coupled to the intermediate node, and the second end of the second memristor is coupled to the first end of the second switch; and the second end of the second switch is coupled to the inverted bit line;

wherein the intermediate node controls the control end of the comparison switch.

* * * * *